May 28, 1957 G. E. HANSELL ET AL 2,794,120

AUTOMATIC FREQUENCY CONTROL

Filed June 11, 1954 4 Sheets-Sheet 1

INVENTORS
GRANT E. HANSELL AND
JAY BRANDINGER

BY [signature]
AGENT

May 28, 1957 G. E. HANSELL ET AL 2,794,120

AUTOMATIC FREQUENCY CONTROL

Filed June 11, 1954 4 Sheets-Sheet 3

INVENTORS
GRANT E. HANSELL AND
JAY BRANDINGER
BY F. A. Reckif
AGENT

May 28, 1957 G. E. HANSELL ET AL 2,794,120

AUTOMATIC FREQUENCY CONTROL

Filed June 11, 1954 4 Sheets-Sheet 4

INVENTORS
GRANT E. HANSELL AND
JAY BRANDINGER
BY F. A. Rechif
AGENT 2,794,120

AUTOMATIC FREQUENCY CONTROL

Grant E. Hansell and Jay Brandinger, Riverhead, N. Y., assignors to Radio Corporation of America, a corporation of Delaware Application June 11, 1954, Serial No. 436,208

9 Claims. (Cl. 250—20)

Figure 1A:
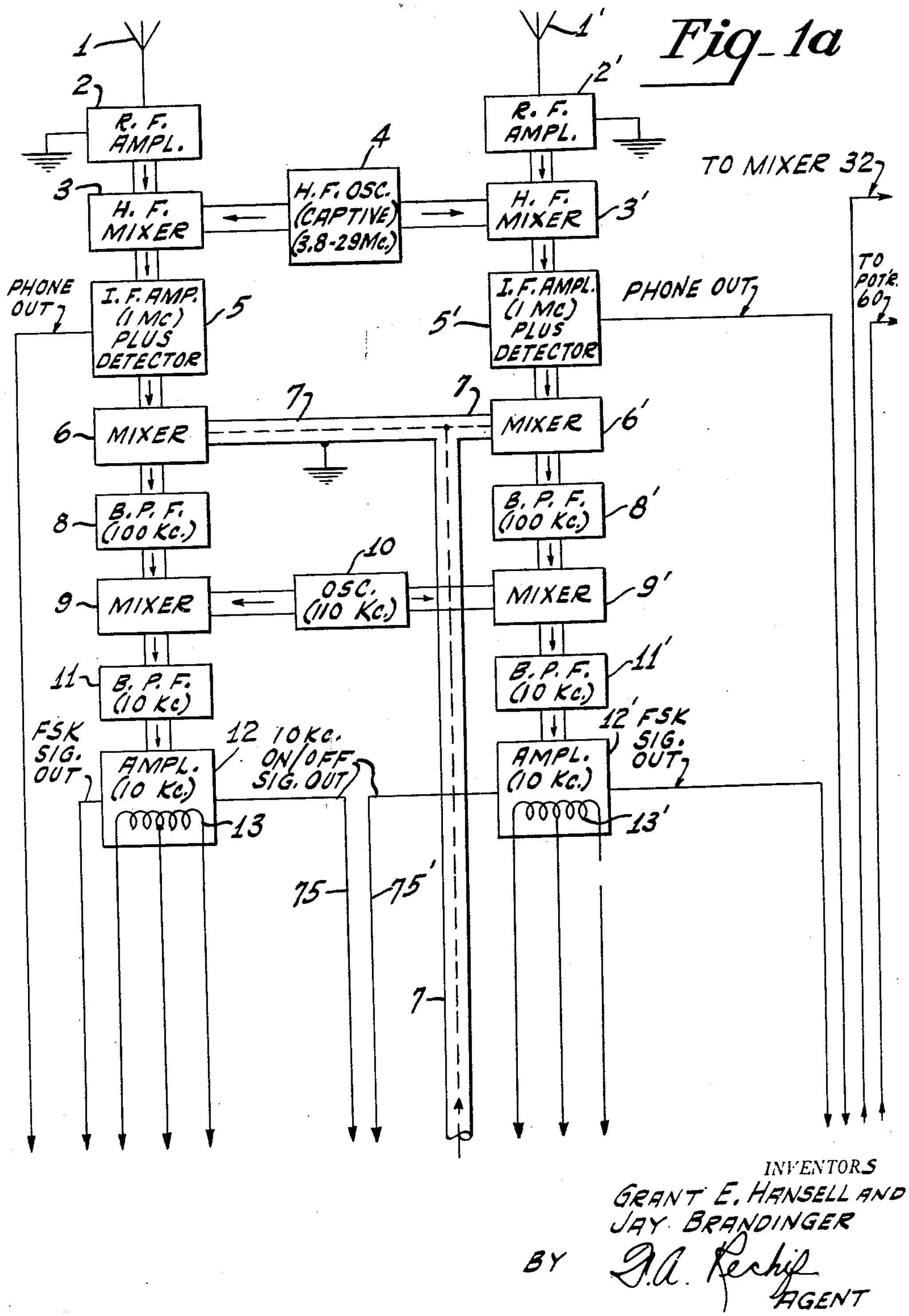
Figure 1B:
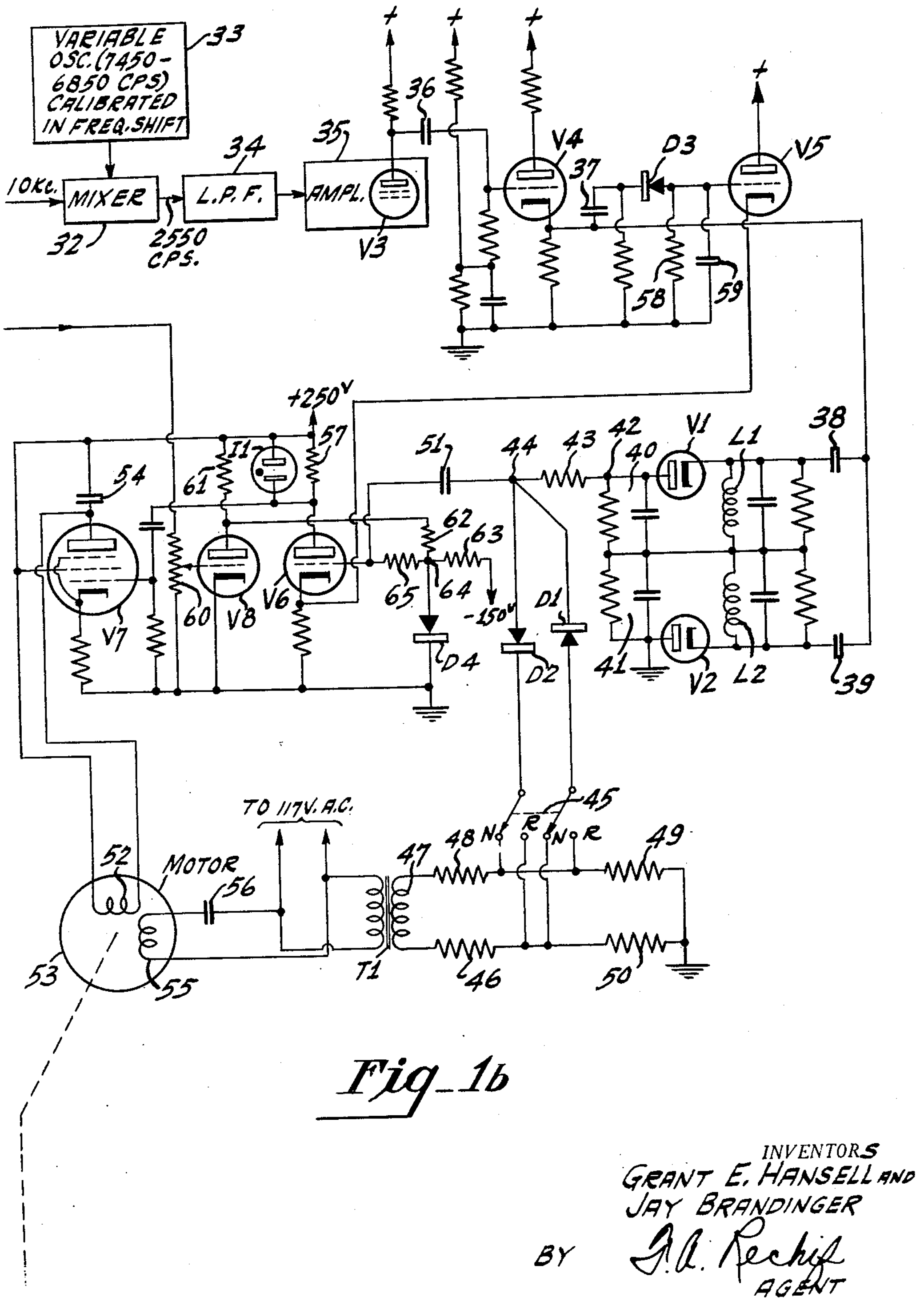
Figure 1C:
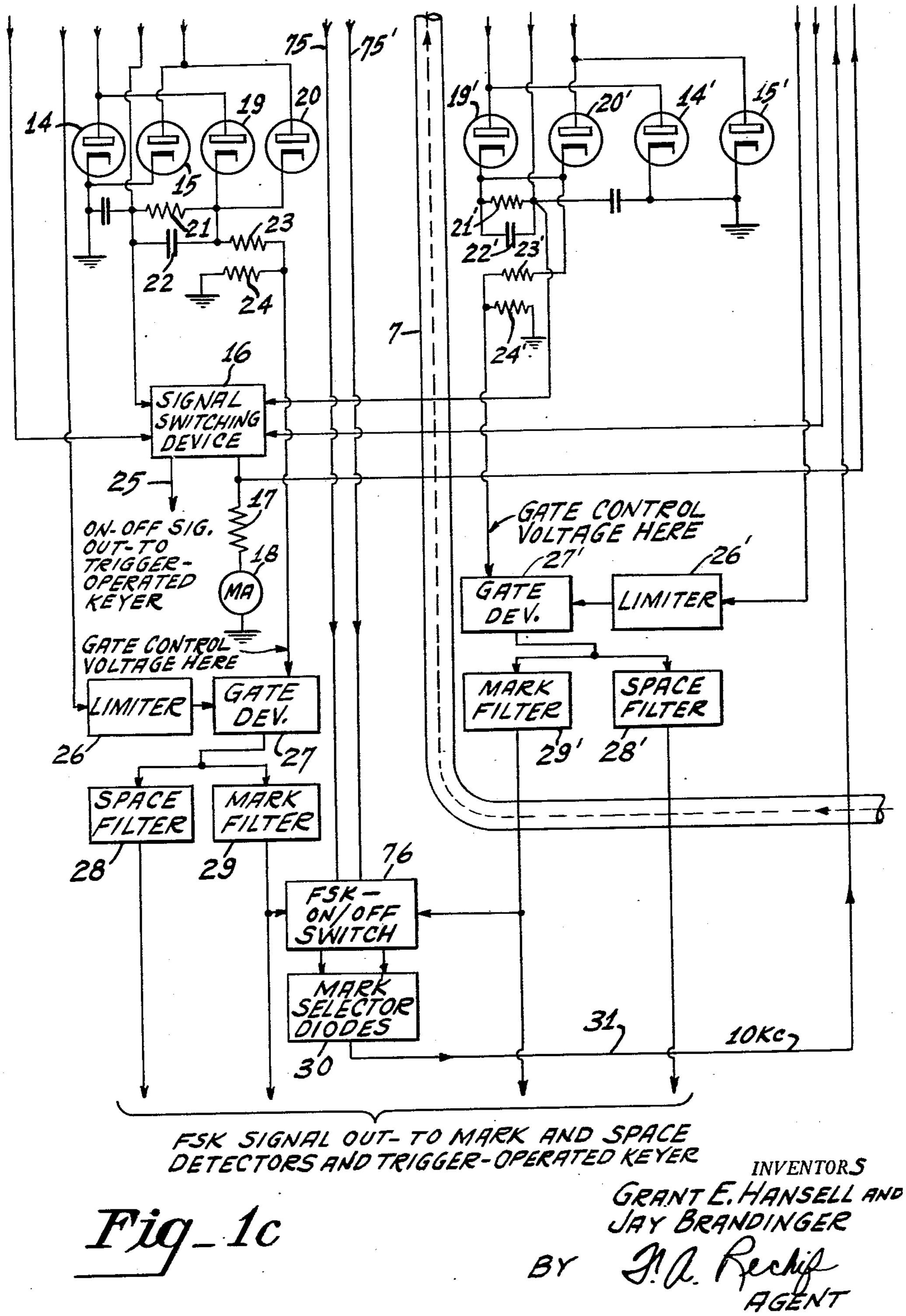
Figures 1D, 2:
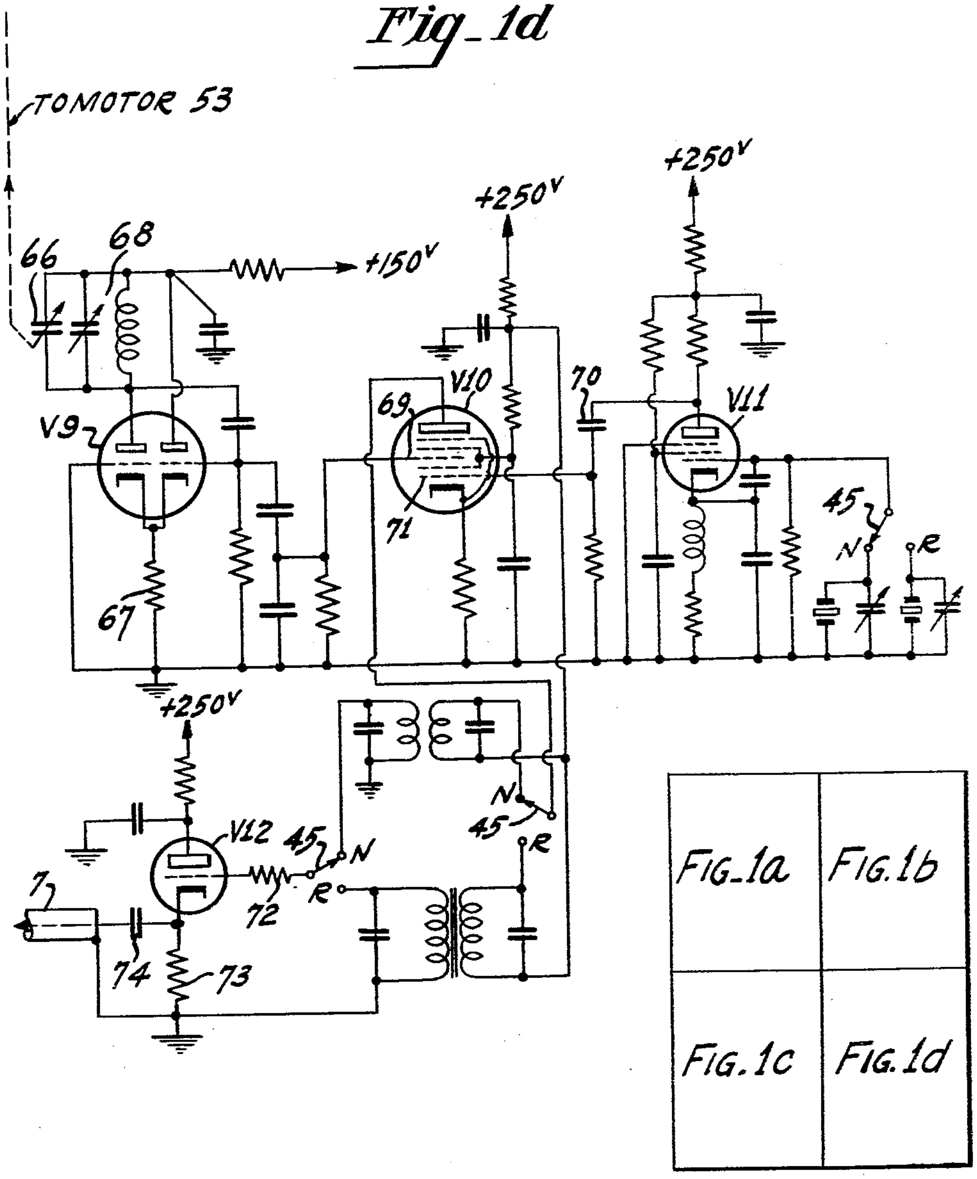

This invention relates to automatic frequency control (AFC) of an oscillator, and more particularly to a system for AFC of a heterodyne oscillator in a receiver for telegraphy or telephony.

This invention operates to maintain proper receiver tuning when receiving any of the following types of signals: On-off telegraph (either Morse or printer), or frequency shift telegraph.

For on-off telegraph signals, continuous correction of the receiver tuning should be maintained as long as the signal is being received. Correction of tuning should be independent of keying bias or percent mark, and correction should be maintained as long as the signal is on the air, whether or not it is being keyed. If the signal goes off the air the tuning correction should be inoperative, and the receiver should remain on its signal tuning for an indefinite time after the signal has disappeared, ready to resume if and when the signal comes on the air again.

For frequency shift (FS) telegraph signals, the center frequency between mark and space should be tuned to the center of the receiver selectivity. Also, the receiver tuning should be independent of percent mark or keying bias and should be independent of the total amount of frequency shift being used. The tuning control should still be operative in the absence of keying when the signal stops on mark frequency, as this is the normal condition for FS printer operation. The tuning control should be inoperative in the absence of keying if the signal stops on space frequency (in this case, the receiver should remain on its final tuning for an indefinite time). Thus, the tuning control should be responsive to only mark frequency, and a means should be provided to correct for reversed keying of the transmitter, to maintain the tuning control on the mark frequency.

Accordingly, an object of this invention is to devise a novel electrical circuit arrangement meeting the above requirements.

More specifically, an object is to provide a novel AFC arrangement for on-off telegraph receivers which will function continuously during reception of signal but will be disabled if the signal goes off the air.

Another object is to provide a novel AFC arrangement which will function continuously during reception of keyed signal or steady mark frequency but will be disabled when the received frequency shift keyed (FSK) signal goes off the air or stops keying on space frequency.

A further object is to provide, in an AFC circuit for a receiver, a novel squelch circuit which operates to disable the AFC under weak signal or no-signal conditions.

The objects of this invention are accomplished, briefly, in the following manner: By means of a tunable local oscillator and converter, a fixed frequency in the audio range is derived from an intermediate frequency present in the radio receiver, this fixed frequency representing either mark frequency (for FSK signals) or carrier frequency (for on-off-keyed signals). The output voltage of a discriminator centered at this fixed audio frequency controls the flow of current, through an amplifier tube, to one winding of a two-phase oscillator tuning control motor. An AFC squelch circuit is provided which functions to cut off this amplifier tube, thus disabling the AFC, if the fixed frequency referred to falls to a low amplitude or disappears. Another AFC squelch circuit or thresholding circuit is provided which functions to cut off the amplifier tube in the motor energization circuit if the transmitted signal goes off the air or if the signal strength in the receiving antenna falls to a low value.

The foregoing as well as other objects of this invention will be better understood from the following description of an exemplification thereof, reference being had to the accompanying drawing, wherein the single figure is a schematic diagram of an AFC system according to this invention.

Now referring to the drawing, the figure illustrates an AFC circuit in conjunction with a dual-diversity receiving system, that is, a receiving system including two separate receivers arranged in diversified relation with respect to a remote transmitter. The description will be particularized with reference to a single receiver, references being made from time to time, when necessary, to diversity reception. Similar elements in the two diversity channels are denoted by the same reference numerals, the elements in one channel being denoted by primed reference numerals. The telegraph signals transmitted from a remote transmitter are picked up by two antennas 1 and 1', which are arranged in space or polarization diversity with respect to the transmitter, and the signals are supplied to the respective R. F. amplifiers 2 and 2', which constitute the first units in the respective receivers.

Continuing with the description of one channel, the output of amplifier 2 is fed to a high frequency mixer 3 where the signal is heterodyned down by energy supplied from a high frequency oscillator 4. Oscillator 4 feeds heterodyning energy to both mixers 3 and 3'. Oscillator 4 is tunable over a range of 3.8 to 29 mc., as indicated, and is arranged in a captive oscillator system for accurate control and stabilization at any frequency within this range. The captive oscillator system may be of the type disclosed in the copending application, Serial No. 446,294, filed July 28, 1954, for example. The R. F. amplifier 2 is tunable over a range of 2.8 to 28 mc., so that the signal out of mixer 3 is at an intermediate frequency (I. F.) of 1 mc. and this signal is fed to an I. F. amplifier 5. The receiver of this invention is designed to be used for FS telegraph, on-off telegraph, or phone signals transmitted within the carrier frequency range extending from 2.8 to 28 mc.

The 1-mc. I. F. amplifier 5 includes a detector by means of which the received telephone signals are rectified for utilization, these signals of audio frequency (voice) appearing in the lead labeled "phone out," which lead is connected to the signal switching device 16. The output of amplifier 5 is fed to a mixer 6 to which are also supplied, by means of a coaxial cable 7, oscillations whose frequency is either 1100 kc. or 900 kc. from a source to be later described in detail. The frequency of this source, in effect, is controlled by the AFC system of this invention. The oscillator referred to feeds heterodyning oscillations to both mixers 6 and 6'. The 1-mc. output of amplifier 5 beats with the 900 kc. or 1100 kc. frequency supplied by the AFC oscillator to produce a 100-kc. signal which is fed through a bandpass filter 8 centered at 100 kc., to a third mixer 9. Heterodyning energy is fed to mixers 9 and 9' from an LC oscillator 10 operating at 110 kc., to produce a beat frequency of 10 kc. which is fed through a bandpass filter 11 centered at 10 kc., to an I. F. amplifier 12 working at 10 kc. Essentially, the output frequency of this amplifier 12 is to be maintained constant at 10 kc. by the AFC arrangement of the invention.

13 indicates the secondary winding of a step-down transformer the primary of which is supplied by a cathode follower output stage of amplifier 12. Opposite ends of winding 13 are connected to the respective anodes of two on-off keying diodes 14 and 15 the cathodes of which are grounded. The center tap on winding 13 is connected through a signal switching device 16 (for selective switching of on-off keyed signals or FSK signals) to the common AGC diode load resistor 17 for the diversity receiver. Likewise, the center tap on winding 13′ of the other diversity receiver is connected through switching device 16 to this same diode load resistor 17, and through the milliammeter 18 to ground. A negative voltage is developed across resistor 17 which is dependent upon, or proportional to, the strength of the combined signal input picked up by the two diversity antennas 1 and 1′. This negative voltage is utilized in the AFC circuit of this invention, as will be hereinafter described.

Opposite ends of winding 13 are connected to the respective anodes of two gate diodes 19 and 20 the cathodes of which are connected together and through an individual diode load resistor 21 (individual to this particular one of the two diversity receivers), shunted by a capacitor 22, to the center tap of winding 13 and thus to the upper or ungrounded end of common load resistor 17. Likewise, opposite ends of winding 13′ are connected to the respective anodes of two gate diodes 19′ and 20′ the cathodes of which are connected together and through an individual diode load resistor 21′ (individual to this particular one of the two diversity receivers), shunted by a capacitor 22′, to the center tap of winding 13 and thus to the upper or ungrounded end of common load resistor 17. The voltage developed across the common load 17 is combined with the voltages developed across each of the separate loads 21 and 21′ to derive two gate control voltages which are produced respectively at the common junction of the cathodes of diodes 19 and 20 and at the common junction of the cathodes of diodes 19′ and 20′. The relative amplitudes and senses of these two gate control voltages depend upon which of the two diversified receiver channels has the stronger signal and these control voltages are used to control gate devices to gate the stronger of the two diversified signals to a common output circuit. The gate control voltage at the common junction of the cathodes of diodes 19 and 20 is divided down by a voltage divider consisting of a series resistor 23 and a shunt resistor 24, while the gate control voltage at the common junction of the cathodes of diodes 19′ and 20′ is divided down by a voltage divider consisting of series resistor 23′ and shunt resistor 24′.

The phone output from the detector in amplifier 5 and the on-off signal from the on-off keying diodes are applied to the signal switching device 16. If on-off keying is selected in device 16, the on-off keyed signal appears in output connection 25 and is fed to a suitable trigger-operated keyer (not shown) for utilization.

The FSK signal out of amplifier 12 is fed through a limiter 26 to a gate device 27 to which the gate control voltage from the junction of resistors 23 and 24 is fed for control purposes. If the FSK signal in amplifier 12 is the stronger, the gate control voltage applied to device 27 is such as to open this gate, applying the signal to the common input of a space filter 28 and a mark filter 29. The outputs of filters 28 and 29 go to mark and space detectors and a trigger-operated keyer for utilization purposes. Similarly, the FSK signal out of amplifier 12′ is fed through a limiter 26′ to a gate device 27′ to which the gate control voltage from the junction of resistors 23′ and 24′ is fed for control purposes. If the FSK signal in amplifier 12′ is the stronger, the gate control voltage applied to device 27′ is such as to open this gate, applying the signal to the common input of a space filter 28′ and a mark filter 29′. The outputs of filters 28′ and 29′ go to mark and space detectors and the trigger-operated keyer previously referred to in connection with filters 28 and 29, for utilization purposes.

The arrangement described, including the diode diversity gating arrangement, the gates, the mark-space filters and the mark-space detectors, is preferably like that disclosed in Trevor Patent No. 2,619,587, dated November 25, 1952.

The foregoing has described the essentials of the signal receiving and utilizing features of a receiver embodying this invention. The AFC system of the invention will now be described. As previously stated, this AFC system functions to maintain the frequency of the heterodyning energy fed to mixers 6 and 6′ at the correct value, which may be eihter 1100 kc. or 900 kc., depending upon the sense of the keying.

In order to feed on/off keyed signals into the AFC unit now to be described, 10-kc. on/off signals may be taken out of amplifier 12, from a point following the 1200 C. P. S. (bandwidth) bandpass filter centered at 10 kc. (the so-called "roofing filter") which is included in amplifier 12. This signal so taken out appears in connection 75 and is applied to one pole of a double-pole, double-throw FSK-on/off switch 76. Likewise, 10-kc. on/off signals may be taken out of amplifier 12′, from a point following the 1200 C. P. S. (bandwidth) bandpass filter centered at 10 kc. (the "roofing filter") which is included in amplifier 12′. This signal so taken out appears in connection 75′ and is applied to another pole of the switch 76. When switch 76 is in the "on/off" position, the signals appearing in connections 75 and 75′ are passed on to the mark selector diodes 30 by the two couplings illustrated. The connection or lead numbered 31 extends from the output side of diodes 30 to a mixer 32 in the AFC unit. Thus, for on/off keying the AFC input is taken from the diversity receiver proper, by means of switching, after the final receiver selectivity, which is centered at 10 kc.

A portion of the output of mark filter 29 is fed to another terminal of switch 76, while a portion of mark filter 29′ is fed to still another terminal of said switch. When switch 76 is in the "FSK" position the "mark frequency" outputs of filters 29 and 29′ are passed on to the selector diodes 30 by the same two couplings previously referred to (between the output side of switch 76 and the input side of diodes 30). Thus, for FSK the AFC input is taken from the mark filters 29 and 29′.

For both on/off keyed and FSK signals, simple diode gating is effected by the mark selector diodes 30, to select for utilization in the AFC unit the stronger of the two diversity receiver mark (for FSK signals) or carrier (for on/off keyed signals) signals. The action of the selector diodes 30 is quite similar to that described in Trevor Patent No. 2,613,271, dated October 7, 1952. For on/off keying the input frequency to the AFC unit (the frequency in lead 31) is 10 kc., as indicated adjacent this lead, and for FSK the input frequency to the AFC unit (that is, mark frequency) is 10 kc. minus the frequency deviation, which deviation is one-half of the total FS. As an example, if a FS of 850 C. P. S. is used the frequency deviation is $\pm 425$ C. P. S. and the input to the AFC unit (for FS keying in the normal sense, wherein mark frequency is below the nominal "carrier") would be 9575 C. P. S.

The input to the AFC unit is applied by means of lead 31 to a mixer 32, to which is also applied heterodyning energy from an oscillator 33, in order to develop a difference frequency of 2550 C. P. S. for passage through a low pass filter 34 having a cut-off frequency of 4 kc. The oscillator 33 is a variable-frequency oscillator, variable from 7450 C. P. S. to 6850 C. P. S. and calibrated in frequency shift. Obtaining a difference frequency of 2550 C. P. S. in mixer 32 is accomplished by setting the frequency of oscillator 33 to a frequency of 7450 C. P. S. for on/off keyed signals and to a frequency of 7450

C. P. S. minus the frequency deviation for frequency shift keyed signals. The variable capacitor in oscillator 33 which is used for varying the frequency of this oscillator is calibrated in cycles of shift, zero shift (corresponding to 7450 C. P. S. for the oscillator output frequency) being the proper setting for on-off keyed signals. For a FS of 850 C. P. S. (deviation of 425 C. P. S.), with FS keying, the frequency of oscillator 33 would be 7025 C. P. S.

The 2550-C. P. S. signal is passed by filter 34 and applied to an amplifier 35 including a tube V3 the anode of which is coupled by means of a capacitor 36 to the grid of a tube V4 connected as a cathode follower. Tube V4 is used to lower the impedance and drive the crystal rectifier D3 through a capacitor 37 coupled between the cathode of tube V4 and such rectifier. The end of rectifier D3 remote from capacitor 37 is connected to the grid of a triode V5. The action of D3 and tube V5 will be explained hereinafter. The cathode follower V4 also drives a discriminator circuit centered at 2550 C. P. S. and including a pair of rectifiers V1 and V2.

For the discriminator, the cathode of tube V4 is coupled through a capacitor 38 to the cathode of diode V1 and is coupled through a capacitor 39 to the cathode of diode V2. The input circuit of the discriminator includes two tuned circuits including respective inductors L1 and L2, L1 being tuned to 2430 C. P. S. and L2 being tuned to 2670 C. P. S. Diode V1 is connected to the 2430-C. P. S. circuit and diode V2 is connected to the 2670-C. P. S. circuit. In this way, the familiar S-shaped characteristic curve of input frequency vs. output voltage is obtained, this curve being centered (zero output voltage) at 2550 C. P. S. input frequency and the discriminator peaks being plus and minus 120 C. P. S. from this, at 2670 and 2430 C. P. S. The usual discriminator output filter networks 40 and 41 are provided, one end of network 41 (and the anode of diode V2) being grounded and the discriminator output voltage appearing at one end of network 40 (the anode of diode V1), point 42. The common junction points of networks 40 and 41, and of the two tuned input circuits, are all tied together. The discriminator circuit is arranged to give a step-up in voltage from the low impedance cathode follower V4 to the high impedance tuned circuits at the discriminator input. Also, it should be noted that there are no active elements in the discriminator to affect the centering thereof, both tuned circuits (in the discriminator input) being driven from the same voltage source.

The direct potential at terminal or point 42, with respect to ground, may be either plus or minus or zero, depending on the direction of variation of the discriminator input frequency (output of mixer 32) with respect to the predetermined desired frequency of 2550 C. P. S. The magnitude of such potential at 42 depends upon the amount of frequency error. The direct potential output of the discriminator at point 42 is applied through a resistor 43 to the common junction point 44 of two oppositely-arranged crystal diodes D1 and D2 which are connected in series across about three volts, 60 C. P. S. from the secondary winding of a filament transformer T1 the primary winding of which is supplied from a suitable source of 117-volt, 60-C. P. S. power. These connections may be traced as follows. A lead extends from the electrode of D1 opposite to point 44, through one pole of normal-reverse (N–R) switch 45 and, in the "normal" switch position shown, through a resistor 46 to one end of the secondary winding 47 of transformer T1. A lead extends from the electrode of D2 opposite to point 44, through another pole of switch 45 and, in the switch position shown, through a resistor 48 to the other end of the winding 47. One end of winding 47 is connected to ground through the two series resistors 48 and 49, while the other end of this winding is connected to ground through the two series resistors 46 and 50.

Point 44 is coupled through a coupling capacitor 51 to the grid of an amplifying triode vacuum tube V6 which constitutes the first stage of a two-stage resistance-coupled amplifier the second stage of which is constituted by pentode vacuum tube V7. This two-stage amplifier is a more or less conventional voltage amplifier, amplifying the 60-cycle voltages appearing at point 44. The anode of tube V7 is directly coupled to one end of one of the motor windings 52 of a two-phase motor 53, the opposite end of this winding being connected to the positive terminal of a unidirectional voltage source +250 v., so that the D. C. flowing through amplifier tube V7 flows also through winding 52. Winding 52 may be described as the controlled motor winding. A capacitor 54 is connected across winding 52 to tune the same to resonance at 60 C. P. S., thus providing a parallel resonant circuit in the output of the amplifier tube V7.

The other winding 55 of motor 53 is connected through a phasing capacitor 56 to the same source of alternating voltage (117 v., A. C.) used to supply the primary winding of transformer T1. Winding 55 is therefore constantly energized.

The circuit described, including the diodes D1 and D2 which are fed with alternating current, operates to provide 60 C. P. S. voltage to the grid of tube V6 with a phase reversal depending upon the polarity of the D. C. output voltage of the discriminator at point 42. In other words, for zero discriminator output, no 60 C. P. S. voltage is fed to the grid of V6, for a positive discriminator output 60 C. P. S. of one phase is fed to V6, while for a negative discriminator output 60 C. P. S. voltage of the opposite phase is fed to V6. More specifically, with a positive D. C. voltage at point 42, point 44 alternates between this positive voltage and zero or ground; with a negative D. C. voltage at 42, point 44 alternates between this negative voltage and ground. Therefore, the phase of the 60-C. P. S. voltage applied to the grid of tube V6 reverses when the D. C. potential at 42 goes from positive to negative. This action is described somewhat more fully in connection with Fig. 3 of Trevor Patent No. 2,644,035, dated June 30, 1953.

The 60-C. P. S. voltage supplied to the grid of V6 is amplified by V6 and V7 to drive the motor 53. The motor 53 being a two-phase motor, reverses in direction when the 60 C. P. S. phase supplied to winding 52 is reversed. Thus, the motor reverses in direction when the polarity of the discriminator D. C. output reverses. As previously stated, the D. C. flowing through the amplifier tube V7 flows also through the motor winding 52. This provides a braking action for the motor when no correction is required, and prevents over-shooting of the motor drive.

A neon glow-discharge tube 11 is connected across the anode resistor 57 of tube V6, to serve as an indication of AFC operation. When tube V6 conducts, a voltage drop is produced across resistor 57 which is sufficient to light the lamp 11.

According to this invention, two circuits are provided for disabling the AFC system described if the received signal goes off the air or if it fades too deeply for use, or if the received FSK signal stops on space. These two circuits are in the nature of squelch or threshold control, and both operate by cutting off the tube V6, thus preventing any 60-C. P. S. voltage from reaching motor winding 52.

As previously described, a portion of the output signal from cathode follower V4 is coupled through capacitor 37 to rectifier D3. The load for this rectifier consists of a resistor 58 paralleled by a capacitor 59. This rectifier is so polled that a normal signal in the output of tube V4 (at 2550 C. P. S.) is rectified by D3 to develop a negative voltage across resistor 58 (and applied to the grid of tube V5) sufficient to cut off tube V5. If low input or no input is supplied to the AFC unit (this could result from the signal stopping on space when receiving FSK signals, since it will be remembered that only mark frequency passed by the mark filters is supplied to mixer 32, or it may result from the received signal going "off the air"), the negative voltage at the grid of V5 due to rectification by D3 will be reduced or will disappear, allowing V5 to conduct. This in turn produces a positive voltage at the cathode of V5. A direct connection extends from the cathode of V5 to the cathode of V6, so that this positive voltage is applied to the cathode of V6. This action cuts off the amplification of tube V6, preventing any 60-C. P. S. voltage from reaching motor winding 52, thus deenergizing the motor and disabling the AFC system. Thus, the requirement of disabling the AFC system if the FSK signal stops on space (under which condition there is no signal in the output of V4) is accomplished. Moreover, the time constants of the disabling circuit described are fast enough to stop the AFC action during the length of a space character (even during keying), so that the AFC action is a function of the mark frequency only. This means that the AFC oscillator will not be caused to vary undesirably from the proper frequency during space intervals of the keyed signal or if the keyed signal stops on space. The tuning motor 53 is deenergized when tube V6 is cut off, thus causing the frequency controlled oscillator to remain on its final tuning for an indefinite period after the signal has disappeared, as long as tube V5 conducts to bias off tube V6 in the manner previously described.

Also, with on-off telegraph signals, if the signal goes off the air no input is supplied to the AFC unit, causing tube V5 to conduct to bias off tube V6 in the manner previously described. Then, the motor 53 is deenergized, so that the AFC unit is rendered inoperative and the controlled oscillator remains fixed on its final tuning for an indefinite period after the signal has disappeared.

Another circuit for disabling the AFC functions to provide a thresholding action for weak signals, such that the presence of signals below a predetermined amplitude in the receiver results in disabling or squelching of the AFC. Then, the AFC will not function erratically in response to noise signals which may be present in the receiver and which might otherwise cause the AFC oscillator to be driven to an undesired frequency value. This circuit includes the diode vacuum tube V8, now to be described.

Tube V8, which may be one-half of a 12AX7 tube the other half of which is V6, has its grid connected to the movable arm of a "threshold" potentiometer 60, while the cathode of tube V8 is grounded. One end of potentiometer 60 is grounded, while the "high" end of said potentiometer is connected to the "high" end of the common AGC diode load resistor 17 (that is, the end of resistor 17 opposite to milliammeter 18 and ground). Thus, the potentiometer 60 is connected across the receiver common diode load 17. As previously stated, the diode load 17 has developed thereacross a negative voltage which is dependent upon the strength of the combined signal input picked up by the two antennas 1 and 1′. This negative voltage is divided down to the proper amount by potentiometer 60 so that for strong signal the grid V8 is provided with cutoff bias. In other words, for normal signal levels V8 is cut off. Under this condition there is a high positive voltage at the anode of V8.

A voltage divider consisting of three resistors 61, 62 and 63 is connected between the positive terminal +250 v. and a negative terminal −150 v. of a suitable unidirectional potential source, the anode of V8 being connected to the common junction of resistors 61 and 62. The resistance values of this divider are such that the junction point 64 of resistors 62 and 63 would be slightly positive if it were not for the action of a diode rectifier D4 which is connected between point 64 and ground. Diode D4 is connected in such a way that it conducts on positive voltage, clamping point 64 at essentially zero potential under this condition, which is the normal operating condition. A resistor 65 is connected between point 64 and the grid of V6, so that the potential of point 64 is applied to such grid.

If the transmitted signal goes off the air or becomes very weak, the negative voltage at the "high" end of the common AGC diode load resistor 17 is reduced, reducing the negative voltage at the grid of V8 and allowing this tube to conduct. This lowers the potential at the anode of V8 due to increased current flow through resistor 61, which is the anode load resistor for tube V8. The divider action of resistors 61, 62 and 63 is now (with the lower potential at the junction of resistors 61 and 62) such that point 64 goes to a negative potential, cutting off tube V6 (the amplifier tube for the 60-C. P. S. voltage supplied to motor winding 52) and stopping the motor 53. Then, the AFC is disabled. Since the "threshold" potentiometer 60 is adjustable, the operating point can be selected such that the AFC action will be cut off when the received signal drops below the desirable useful level. To describe this disabling action in another way, the threshold potentiometer 60 can be adjusted such that when the signal in the receivers drops below a certain desirable level tube V8 conducts and biases off V6 through the connection from the anode of V8 to the grid circuit of V6.

The tuning motor 53 drives the AFC capacitor 66 connected as a part of the circuit of a cathode-driven oscillator including tube V9, operating in the range of 375 kc. The tube V9 is a twin triode tube, for example of the 12AU7 type, the cathodes of which are coupled by means of a common cathode resistor 67. A resonant circuit 68 is connected between the two anodes of V9, the capacitor 66 being connected across this circuit and providing a tuning range of ±1 kc. This cathode-driven oscillator including V9 functions as described in Crosby Patent No. 2,269,417, dated January 6, 1942.

A capacitive voltage divider is connected between the right hand grid of tube V9 and ground, and output is taken from an intermediate point on this divider and applied to one grid 69 of a pentagrid mixer tube V10, for example of the 6BE6 type. A crystal oscillator including tube V11 operates at a frequency of either 1475 kc. or 1275 kc., depending upon the particular crystal selected by another pole of the "N–R" switch 45. The oscillatory energy from the crystal oscillator circuit including tube V11 is supplied through a coupling capacitor 70 to another grid 71 of mixer tube V10.

The 375-kc. output of the AFC oscillator V9 is mixed in V10 with either 1475 kc. or 1275 kc. from V11 to produce a difference frequency of 1100 kc. or 900 kc. This difference frequency is passed from the anode or output circuit of mixer V10 through the proper bandpass filter as selected by two additional poles of the "N–R" switch 45 and through a resistor 72, to the grid of a cathode follower output tube V12. The heterodyne oscillator frequency of 1100 kc. or 900 kc., which is thus automatically controlled in frequency by tuning motor 53 in the manner previously described, is taken from across cathode resistor 73 of the cathode follower tube V12 and through a coupling capacitor 74, and applied by means of the coaxial line 7 to the two receiver mixers 6 and 6′. Thus, the output of V12 is used as the second conversion or heterodyne oscillator frequency of the receiver, to convert the first I. F. of 1 mc. to the second I. F. of 100 kc., in mixers 6 and 6′. In this way, the AFC output of V12 varies the tuning of the two diversity receivers to keep them properly tuned to the incoming signal at all times.

As previously described, the output of V12 can be either 1100 kc. or 900 kc., this choice being provided by the action of "N–R" switch 45, all sections of which are ganged. One section of switch 45 (associated with V11) selects crystals to make V11 operate at 1475 or 1275 kc. Two sections of switch 45 are used to select the proper bandpass filter in the anode circuit of V10 to pass either 1100 or 900 kc. Two more sections of switch 45 (associated with D1 and D2) are used to reverse the phase of the 60 C. P. S. being fed to diodes D1 and D2, this being necessary to give proper AFC control direction for the motor 53. Switch 45 not only corrects reversed keying for the receiver output but also assures that mark frequency will always be used for the AFC unit, even if the transmission is reversed. This assures AFC action for printer telegraph operation during the idle condition, as the idle condition for printer operation (under FSK) is mark.

The following component values are given by way of example. These are typical for a receiver built according to this invention and successfully tested.

| | | |
|---|---|---|
| Tube 14 | | ½ 6AL5 |
| Tube 15 | | ½ 6AL5 |
| Tube 19 | | ½ 6AL5 |
| Tube 20 | | ½ 6AL5 |
| Tube V1 | | ½ 6AL5 |
| Tube V2 | | ½ 6AL5 |
| Tube V3 | | 6AU6 |
| Tube V4 | | ½ 12AT7 |
| Tube V5 | | ½ 12AT7 |
| Tube V6 | | ½ 12AX7 |
| Tube V7 | | 6AQ5 |
| Tube V8 | | ½ 12AX7 |
| Tube V9 | | 12AU7 |
| Tube V10 | | 6BE6 |
| Tube V11 | | 6AU6 |
| Tube V12 | | 6C4 |
| Diode D1 | | 1N38A |
| Diode D2 | | 1N38A |
| Diode D3 | | 1N38A |
| Diode D4 | | 1N38A |
| Resistor 17 | ohms | 27,000 |
| Resistor 21 | do | 33,000 |
| Resistor 23 | do | 180,000 |
| Resistor 24 | do | 220,000 |
| Resistor 43 | do | 100,000 |
| Resistor 46 | do | 2,200 |
| Resistor 48 | do | 2,200 |
| Resistor 49 | do | 2,200 |
| Resistor 50 | do | 2,200 |
| Resistor 57 | do | 220,000 |
| Resistor 58 | do | 150,000 |
| Resistor 60 | megohm | 1 |
| Resistor 61 | ohms | 220,000 |
| Resistor 62 | megohm | 1 |
| Resistor 63 | do | 1 |
| Resistor 65 | do | 1 |
| Resistor 67 | ohms | 10,000 |
| Resistor 72 | do | 100 |
| Resistor 73 | do | 4,700 |
| Inductor L1 | henry | 0.65 |
| Inductor L2 | do | 0.6 |
| Capacitor 22 | mmfd | 2,200 |
| Capacitor 36 | mmfd | 390 |
| Capacitor 37 | mfd | 0.01 |
| Capacitor 38 | mmfd | 1,000 |
| Capacitor 39 | mmfd | 910 |
| Capacitor 51 | mfd | 0.1 |
| Capacitor 54 | mfd | 1 |
| Capacitor 56 | mfd | 1 |
| Capacitor 59 | mfd | 0.01 |
| Capacitor 70 | mmfd | 100 |
| Capacitor 74 | mfd | 0.01 |

What is claimed is:

1. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy, controllable means for varying the tuning of said oscillator, a normally-conducting electron discharge device connected in circuit with the controlling path for said last-mentioned means in such a way that said path is broken when said device is non-conducting, said device having a cathode electrode, means responsive to deviations in the frequency of said further altered frequency energy from a predetermined value for causing motor energizing current to flow through said device, thereby energizing said motor to vary the tuning of said oscillator, an electron discharge device having a cathode, means coupling said last-mentioned cathode directly to said first-named cathode electrode through connections devoid of concentrated impedance, an impedance connected between said coupled cathodes and a point of reference potential, and means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff.

2. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy, a tuning motor for varying the tuning of said oscillator, a normally-conducting electron discharge device through which motor energizing current may flow for energizing said motor, said device having a cathode electrode, means responsive to deviations in the frequency of said further altered frequency energy from a predetermined value for causing motor energizing current to flow through said device, thereby energizing said motor to vary the tuning of said oscillator, an electron discharge device having a cathode, means coupling said last mentioned cathode directly to said first-named cathode electrode through connections devoid of concentrated impedance, an impedance connected between said coupled cathodes and a point of reference potential, and means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff.

3. In a radiotelegraph receiver, a heterdyne oscillator the frequency of which is to be controlled, means for mixing heterodyning energy derived from said oscillator with the received signal to produce altered frequency energy, means for heterodyning said altered frequency energy to produce further altered frequency energy in the audio frequency range, a tuning motor for varying the tuning of said oscillator, a normally-conducting electron discharge device through which motor energizing current may flow for energizing said motor, said device having a cathode electrode, a tuned frequency discriminator centered at said further altered frequency, means applying the output of the second-named heterodyning means to said discriminator, means utilizing the output of said discriminator for controlling the flow of motor energizing current through said device, an electron discharge device having a cathode, means coupling said last-mentioned cathode directly to said first-named cathode electrode through connections devoid of concentrated impedance, an impedance connected between said coupled cathodes and point of reference potential, and means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff.

4. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy, a tuning motor for varying the tuning of said oscillator, a normally-conducting electron discharge device through which motor energizing current may flow for energizing said motor, said device having a cathode electrode, means responsive to deviations in the frequency of said further altered frequency energy from a predetermined value for causing motor energizing current to flow through said device, thereby energizing said motor to vary the tuning of said oscillator, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, and means operative in response to a decrease in receiver signal strength below a predetermined value, for biasing said normally-conducting device to cutoff.

5. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy in the audio frequency range, a tuning motor for varying the tuning of said oscillator, a normally-conducting electron discharge device through which motor energizing current may flow for energizing said motor, said device having a cathode electrode, a tuned frequency discriminator centered at said further altered frequency, means applying the output of the second-named heterodyning means to said discriminator, means utilizing the output of said discriminator for controlling the flow of motor energizing current through said device, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, and means operative in response to a decrease in receiver signal strength below a predetermined value, for biasing said normally-conducting device to cutoff.

6. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy, a tuning motor for varying the tuning of said oscillator, a normally-conducting electron discharge device through which motor energizing current may flow for energizing said motor, said device having a cathode electrode and a control electrode, means responsive to deviations in the frequency of said further altered frequency energy from a predetermined value for causing motor energizing current to flow through said device, thereby energizing said motor to vary the tuning of said oscillator, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, and means operative in response to a decrease in receiver signal strength below a predetermined value to provide a cutoff bias on said control electrode.

7. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy, a tuning motor for varying the tuning of said oscillator, a normally-conducting electron discharge device through which motor energizing current may flow for energizing said motor, said device having a cathode electrode and a control electrode, means responsive to deviations in the frequency of said further altered frequency energy from a predetermined value for causing motor energizing current to flow through said device, thereby energizing said motor to vary the tuning of said oscillator, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, an electron flow control device having anode and control electrodes, means coupling said anode electrode to said first-mentioned control electrode, and means responsive to receiver signal strength above a predetermined value for applying a cutoff bias to the control electrode of said flow control device.

8. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy in the audio frequency range, a tuning motor for varying the tuning of said oscillator, a normally-conducting electron discharge device through which motor energizing current may flow for energizing said motor, said device having a cathode electrode and a control electrode, a tuned frequency discriminator centered at said further altered frequency, means applying the output of the second-named heterodyning means to said discriminator, means utilizing the output of said discriminator for controlling the flow of motor energizing current through said device, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, and means operative in response to a decrease in receiver signal strength below a predetermined value to provide a cutoff bias on said control electrode.

9. In a radiotelegraph receiver, a heterodyne oscillator the frequency of which is to be controlled, means for mixing heterodyning energy derived from said oscillator with the received signal to produce altered frequency energy, means for heterodyning said altered frequency energy to produce further altered frequency energy in the audio frequency range, a tuning motor for varying the tuning of said oscillator, a normally-conducting electron discharge device through which motor energizing current may flow for energizing said motor, said device having a cathode electrode and a control electrode, a tuned frequency discriminator centered at said further altered frequency, means applying the output of the second-named heterodyning means to said discriminator, means utilizing the output of said discriminator for controlling the flow of motor energizing current through said device, an electron discharge device having a cathode, means coupling said last-mentioned cathode directly to said first-named cathode electrode through connections devoid of concentrated impedance, an impedance connected between said coupled cathodes and a point of reference potential, means responsive to the presence of said further altered frequency energy in said receiver for maintaining said last-named device cut off, said last-named means operating to cause said last-named device to conduct in response to the absence of said further altered frequency energy in said receiver, the increased voltage across said impedance developed as a result of conduction in said last-named device by way of said coupling means acting to bias said normally-conducting device to cutoff, an electron flow control device having anode and control electrodes, means coupling said anode electrode to said first-mentioned control electrode, and means responsive to receiver signal strength above a predetermined value for applying a cutoff bias to the control electrode of said flow control device.

References Cited in the file of this patent

UNITED STATES PATENTS

| | | |
|---|---|---|
| 2,513,786 | Crosby | July 4, 1950 |
| 2,644,035 | Trevor | June 30, 1953 |